United States Patent
Kim et al.

(10) Patent No.: US 9,748,412 B2
(45) Date of Patent: Aug. 29, 2017

(54) HIGHLY RESPONSIVE III-V PHOTODETECTORS USING ZNO:AL AS N-TYPE EMITTER

(71) Applicant: INTERNATIONAL BUSINESS MACHINES CORPORATION, Armonk, NY (US)

(72) Inventors: Jeehwan Kim, Los Angeles, CA (US); Ning Li, White Plains, NY (US); Devendra K. Sadana, Pleasantville, NY (US); Brent A. Wacaser, Putnam Valley, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/727,344

(22) Filed: Jun. 1, 2015

(65) Prior Publication Data
US 2016/0351728 A1    Dec. 1, 2016

(51) Int. Cl.
H01L 31/02     (2006.01)
H01L 31/0304   (2006.01)
H01L 31/18     (2006.01)

(52) U.S. Cl.
CPC .. *H01L 31/02002* (2013.01); *H01L 31/03046* (2013.01); *H01L 31/1844* (2013.01)

(58) Field of Classification Search
CPC ......... H01L 31/02002; H01L 31/03046; H01L 31/1844
USPC ....................................................... 257/184
See application file for complete search history.

(56) References Cited

U.S. PATENT DOCUMENTS

| | | | |
|---|---|---|---|
| 2010/0221866 A1* | 9/2010 | Graham | H01L 31/035227 438/73 |
| 2012/0000518 A1* | 1/2012 | Tokioka | H01L 31/05 136/255 |
| 2013/0284247 A1* | 10/2013 | Briceno | H01L 31/074 136/255 |
| 2013/0319518 A1 | 12/2013 | Doech et al. | |
| 2014/0020744 A1 | 1/2014 | Hersh et al. | |
| 2014/0196771 A1 | 7/2014 | Auvray et al. | |

FOREIGN PATENT DOCUMENTS

CN          102034902 A       4/2011

OTHER PUBLICATIONS

Sibiński, Maciej, et al. "AZO layers deposited by PLD method as flexible transparent emitter electrodes for solar cells." Microelectronic Engineering 127 (2014): 57-60.*
Han, T., et al. "Low resistance and transparent Ag/AZO ohmic contact to p-GaN." Journal of the Korean Physical Society 65.1 (2014): 62-64.*
Montgomery, K.H., et al., "Development of ZnO—InP Heterojunction Solar Cells for Thin Film Photovoltaics," Photovoltaic Specialist Conference (PVSC), Jun. 2014. (pp. 0524-0527).

* cited by examiner

*Primary Examiner* — Adam S Bowen
(74) *Attorney, Agent, or Firm* — Tutunjian & Bitetto, P.C.; Louis J. Percello

(57) ABSTRACT

A photodiode includes a p-type ohmic contact and a p-type substrate in contact with the p-type ohmic contact. An intrinsic layer is formed over the substrate and including a III-V material. A transparent II-VI n-type layer is formed on the intrinsic layer and functions as an emitter and an n-type ohmic contact.

20 Claims, 4 Drawing Sheets

HIGHLY RESPONSIVE III-V PHOTODETECTORS USING ZNO:AL AS N-TYPE EMITTER

BACKGROUND

Technical Field

The present invention relates to photodiodes, and more particularly to photodiodes with a II-VI n-type layer to reduce fabrication steps and device complexity.

Description of the Related Art

Conventional InGaAs photodiodes include a p-type ohmic contact on one side of a p+ substrate (InP). An InGaAs intrinsic layer is formed on the substrate opposite the p-type ohmic contact. An n-type window layer (e.g., InP (Si doped)) is formed on the InGaAs layer, and an n+ contact layer (e.g., InGaAs (Si doped)) is formed on the window layer. An n-type ohmic contact is formed over the contact layer.

While this structure (n-i-p) provides good performance, there are some operational issues with the photodiode. For example, light absorption at the n+ contact layer results in device losses due to low band gap and low doping concentration in the n+ contact layer. In addition, dark current of the n-i-p photodiode is high. Dark current is the relatively small electric current that flows through a photosensitive device when no photons are entering the device. Incident radiation may enter from the n-type ohmic contact side. This n-type ohmic contact is generally comprised on an opaque metal and therefore needs a reduced footprint to reduce shadowed areas. The shadow areas reduce the performance of the device.

SUMMARY

A photodiode includes a p-type ohmic contact and a p-type substrate in contact with the p-type ohmic contact. An intrinsic layer is formed over the substrate and including a III-V material. A transparent II-VI n-type layer is formed on the intrinsic layer and functions as an emitter and an n-type ohmic contact.

Another photodiode includes a p-type ohmic contact, a p+ III-V substrate in contact with the p-type ohmic contact and a III-V intrinsic layer formed over the substrate. A single layer emitter is formed on the intrinsic layer and includes an Al doped ZnO. The single layer emitter functions as at least an emitter and an n-type ohmic contact. The Al doped ZnO includes a thickness of less than 150 nm.

A method for forming a photodiode includes providing a p-type ohmic contact, a p-type substrate in contact with the p-type ohmic contact and an intrinsic layer formed over the substrate and including a III-V material; and forming a transparent II-VI n-type layer on the intrinsic layer to function as at least an emitter and an n-type ohmic contact.

These and other features and advantages will become apparent from the following detailed description of illustrative embodiments thereof, which is to be read in connection with the accompanying drawings.

BRIEF DESCRIPTION OF THE SEVERAL VIEWS OF THE DRAWINGS

The disclosure will provide details in the following description of preferred embodiments with reference to the following figures wherein.

DETAILED DESCRIPTION

Figure 1:
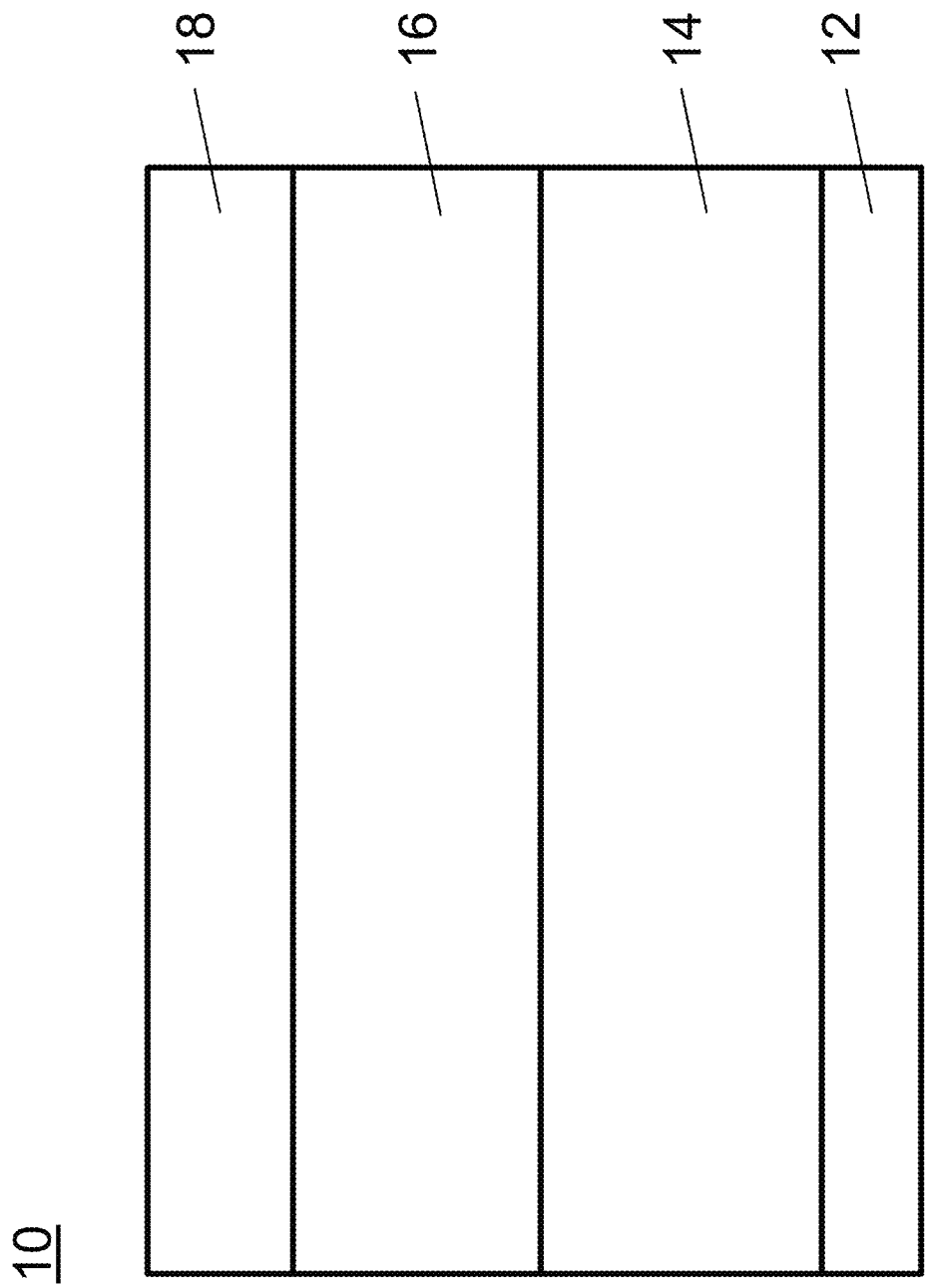
FIG. 1 is a cross-sectional view of a photodiode with a single layer emitter structure in accordance with the present principles.

In accordance with the present principles, a photosensitive device, such as a photodiode is provided that simplifies conventional photodiodes. A II-VI material, such as ZnO, is employed to replace three layers of the conventional device with a single thinner layer. The three layers of the conventional device that are replaced include the n-type semiconductor window layer, the contact layer (n+) and the n-type ohmic contact. Embodiments in accordance with the present principles provide many advantages over the conventional structure. For example, a photodiode in accordance with the present embodiments generates less dark current, provides greater transparency for incident radiation and does not include metal shadowing areas since the II-VI material is transparent for incoming radiation. The II-VI material also provides an extremely low contact resistance.

It is to be understood that the present invention will be described in terms of a given illustrative architecture and photovoltaic stack; however, other architectures, structures, substrates, materials and process features and steps may be varied within the scope of the present invention.

It will also be understood that when an element such as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

A design for a photovoltaic device may be created for integrated circuit integration or may be combined with components on a printed circuit board. The circuit/board may be embodied in a graphical computer programming language, and stored in a computer storage medium (such as a disk, tape, physical hard drive, or virtual hard drive such as in a storage access network). If the designer does not fabricate chips or the photolithographic masks used to fabricate chips or photovoltaic devices, the designer may transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein may be used in the fabrication of photovoltaic devices and/or integrated circuit chips with photovoltaic devices. The resulting devices/chips can be distributed by the fabricator in raw wafer form (that is, as a single wafer that has multiple unpackaged devices/chips), as a bare die, or in a packaged form. In the latter case, the device/chip is mounted in a single chip package (such as a plastic carrier, with leads that are affixed to a motherboard or other higher level carrier) or in a multichip package (such as a ceramic carrier that has either or both surface interconnections or buried interconnections). In any case, the devices/chips are then integrated with other chips, discrete circuit elements, and/or other signal processing devices as part of either (a) an intermediate product, such as a motherboard, or (b) an end product. The end product can be any product that includes integrated circuit chips, ranging from toys, energy collectors, solar devices and other applications including computer products or devices having a display, a keyboard or other input device, and a central processor. The photovoltaic devices described herein are particularly useful for photosensors for electronic devices, homes, buildings, vehicles, etc.

It should also be understood that material compounds will be described in terms of listed elements, e.g., InGaAs or ZnO. These compounds include different proportions of the elements within the compound, e.g., InGaAs includes $In_xGa_{1-x}As$, where x is less than or equal to 1, or ZnO includes $Zn_xO_{1-x}$ where x is less than or equal to 1, etc. In addition, other elements may be included in the compound, such as, e.g., AlInGaAs, and still function in accordance with the present principles. The compounds with additional elements will be referred to herein as alloys.

The present embodiments may be part of a photovoltaic device or circuit, and the circuits as described herein may be part of a design for an integrated circuit chip, a solar cell, a light sensitive device, etc.

Reference in the specification to "one embodiment" or "an embodiment" of the present principles, as well as other variations thereof, means that a particular feature, structure, characteristic, and so forth described in connection with the embodiment is included in at least one embodiment of the present principles. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This may be extended, as readily apparent by one of ordinary skill in this and related arts, for as many items listed.

Referring now to the drawings in which like numerals represent the same or similar elements and initially to FIG. 1, a cross-sectional view of a photodiode 10 is illustratively shown in accordance with the present principles. The photodiode 10 includes a p-type ohmic contact 12 formed on a back of the photodiode 10. The ohmic contact 12 is formed on a p+ doped substrate 14. The p+ doped substrate 14 preferably includes a III-V material, such as InP, although other materials may be employed, e.g., InGaAs, GaAs, etc.

An intrinsic layer 16 is formed on the substrate 14. The intrinsic layer 16 may include a III-V material. In one embodiment, the intrinsic layer 16 includes InGaAs, and more specifically, $In_{53}Ga_{47}As$. The intrinsic layer 16 may have a thickness of about 1 micron, although other thicknesses are contemplated.

In accordance with particularly useful embodiments, an n-type layer 18 is formed on the intrinsic layer 16. The n-type layer 18 includes a II-VI material, such as ZnO, ZnS, ZnSe, CdS, CdTe, etc. In one embodiment, the n-type layer 18 is transparent and may include ZnO, indium tin oxide (ITO), indium zinc oxide (IZO), etc. In one useful embodiment, the n-type layer 18 includes Al doped ZnO (ZnO:Al or AZO). The n-type layer 18 may include a thickness of between about 50 nm to about 200 nm, and preferably about 100 nm. The thickness of the n-type layer 18 should balance between transmissivity of incident radiation (e.g., visible light) and conductivity. The thicker the n-type layer 18 the less transmission and the greater the conductivity.

The n-type layer 18 is thinner than the conventional layers employed on the n-type side of a conventional diode that it replaces. The conventional diode employs a window layer (e.g., having a thickness of about 200-300 nm), a contact layer (e.g., having a thickness of about 20-50 nm) and an n-type ohmic contact (e.g., greater than 200 nm). The conventional layers include a nominal thickness of between about 420 nm to about 550 nm or greater. In accordance the present principles, the window layer, contact layer and the n-type ohmic contact are replaced with a single n-type layer 18. The n-type layer 18 (which does not need an additional metal contact layer) may include a thickness of 100 nm, which is 4-5 (or more) times thinner than the conventional n-type side of a photodiode. In addition, conductivity is maintained or improved and dark current is reduced (due at least to reducing the number of interfaces in the n-type side). Metal shadowing area (e.g., due the metal ohmic contact) is reduced or eliminated, transmission of light is improved (due at least to the reduced thickness and the elimination of metal shadowing) and the structure is simplified making it more cost effective and less complex to fabricate. In particularly useful embodiments, the n-type layer 18 may include a thickness of about 150 nm. A thinner n-type layer 18 (emitter) is preferred. The n-type layer 18 provides a single layer emitter structure.

The formation of ZnO:Al also tends to be easier than III-V materials. For example, instead of epitaxial growth processes (e.g., for n+ InGaAs), ZnO:Al may be formed using atomic layer deposition (ALD), although other processes may be employed. This permits a doped layer with less surface damage. Materials like Al may be formed directly on the ZnO and be annealed to cause diffusion of the Al to dope the ZnO.

In accordance with the present principles, a range of n-doping in ZnO of layer 18 is up to 2 atomic percent (e.g., $\sim 5 \times 10^{21}/cm^3$). ZnO dopants may include Al, B, Ga, In, etc., with Al:ZnO being preferred. ZnO may be deposited or grown by one or more of the following processes, epitaxy, sputtering, atomic layer deposition (ALD), metal organic chemical vapor deposition (MOCVD), etc. The carrier concentration (electron density) of the layer 18 may be between about $1×10^{21}$ cm$^{-3}$ to about $5×10^{21}$ cm$^3$, and preferably about $3.0×10^{21}$ cm$^{-3}$ for doped Aluminum Zinc Oxide (ZnO:Al) (AZO).

The n-type material (e.g., ZnO:Al) is preferably crystalline in form. This includes a monocrystalline structure and may include a multi-crystal structure or other crystalline structure (micro, nano, etc.). However, the AZO material may also include amorphous phases. In one embodiment, the ZnO of layer 18 is amorphous. The underlying layers are also preferably crystalline, but may include other phases.

Figure 2:
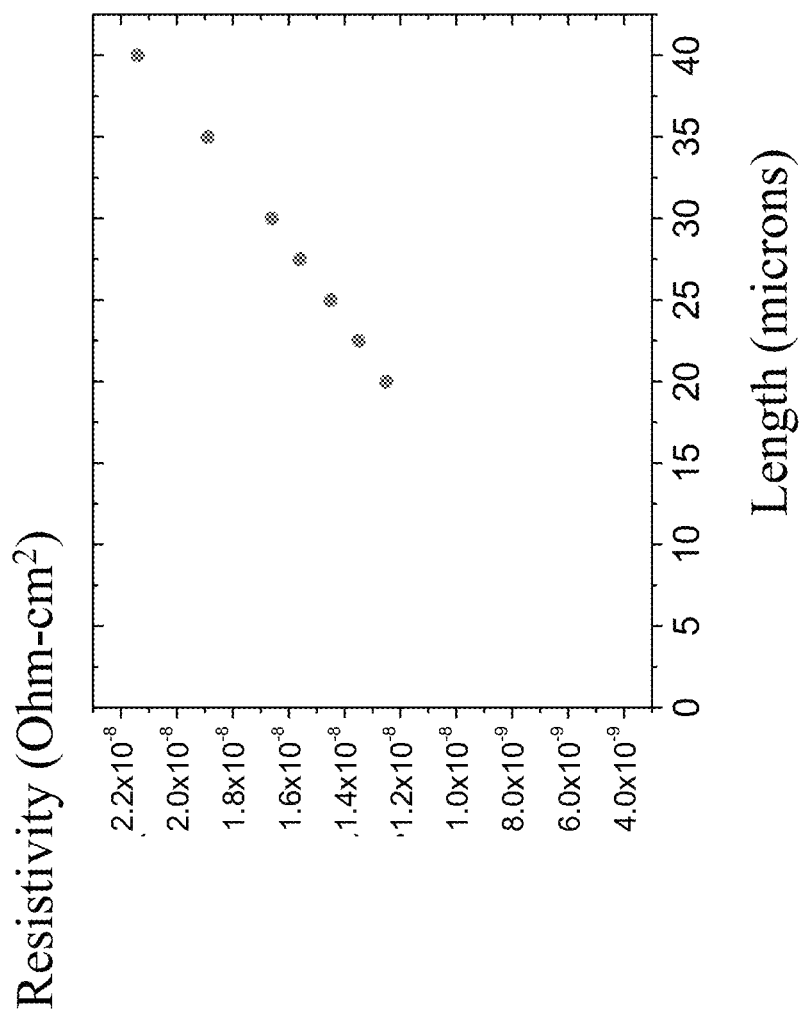
FIG. 2 is a diagram showing ZnO:Al contact resistivity by plotting resistivity (Ohm-cm$^2$) versus length (microns)

Referring to FIG. 2, a plot of resistivity (Ohm-cm$^2$) versus length (microns) in a TLM (transmission line measurement) pattern is illustratively depicted to demonstrate resistive properties of the n-type layer 18 (FIG. 1) in accordance with the present principles. Resistivity is plotted for AZO material.

A conventional photodiode having an ohmic contact including Ti/Pd/Au on an n+ InGaAs n-type material includes a contact resistivity of, e.g., greater than $5×10^{-8}$ Ohm-cm$^2$. In accordance with the present principles, the AZO contact (n-type layer 18) provides a lower contact resistivity (e.g., about $1.3×10^{-9}$ Ohm-cm$^2$), more than one order of magnitude improvement. The conventional photodiode having an ohmic contact including Ti/Pd/Au often needs to be formed in a metal grid pattern to permit light transmission and is needed to increase conductivity on an n+ InGaAs n-type material for a conventional device. This metal grid prevents light transmission (forms shadow areas).

In accordance with the present principles, a single layer of n-type material is employed that provides a sufficient amount of conductivity and is thinner than the conventional n-type structures. The single layer emitter does not need a metal grid since, e.g., doped ZnO provides a highly conductive layer.

Figure 3:
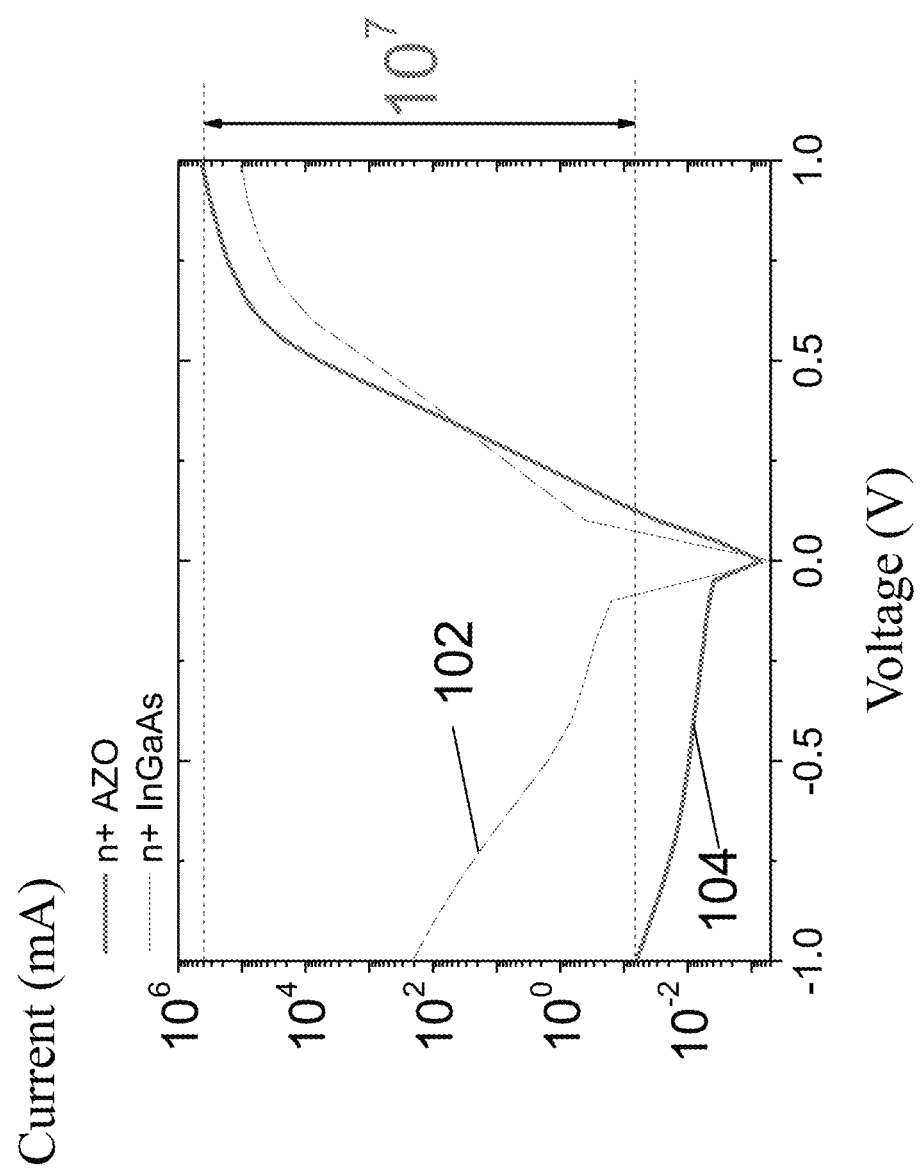
FIG. 3 is a diagram showing absolute value of current (mA) versus voltage (V) for an n+ ZnO:Al photodiode in accordance with the present principles and an n+ InGaAs photodiode in accordance with a conventional structure.

Referring to FIG. 3, a plot of absolute value of current (mA) versus voltage (V) is illustratively depicted to compare a conventional photodiode with a photodiode in accordance with the present principles. A graph 102 shows an I-V curve for a conventional photodiode having an n+ InGaAs layer as an n-type emitter. A graph 104 shows an I-V curve for a photodiode having an n+ AZO layer in accordance with the present principles. Graph 104 shows dark current (e.g., at V=−1.0 V) being three orders of magnitude less than the dark current of graph 102. In addition, graph 102 provides an on/off ratio of about $1×10^3$. Graph 104 provides an on/off ratio of about $10^7$. The on/off ratio of the device of graph 104 is improved by about 4 orders of magnitude over that of the device for plot graph 102. The on/off ratio provides an indication of leakage current and may be defined as the current at 1 V divided by the current at −1 V.

Figure 4:
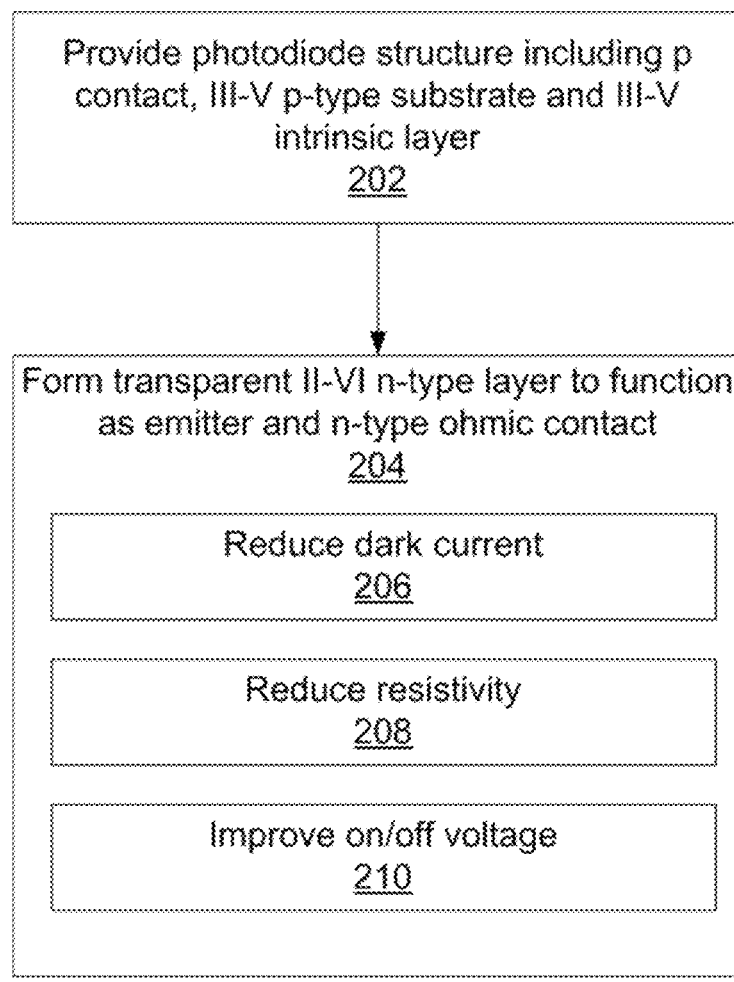
FIG. 4 is a block/flow diagram showing a method for making a photodiode in accordance with illustrative embodiments.

Referring to FIG. 4, a method for forming a photodiode is illustratively shown in accordance with the present principles. In some alternative implementations, the functions noted in the blocks may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

In block 202, a photodiode structure is provided. This includes the preparation and doping of a substrate (e.g., a p-type substrate and in particular a p+ doped substrate). The substrate includes a III-V material such as InP or other suitable material. A p-type ohmic contact is formed on the substrate. The p-type ohmic contact may include a p-type metal or other highly conductive p-type material. An intrinsic layer is formed over the substrate opposite the p-type ohmic contact. The intrinsic layer includes an undoped or lightly doped III-V material. In one particularly useful embodiment, the intrinsic layer includes InGaAs and in particular, In$_{53}$Ga$_{47}$As.

In block 204, a transparent II-VI n-type layer is formed on the intrinsic layer to function as at least an emitter and an n-type ohmic contact. The II-VI n-type layer may include ZnO, and in particular ZnO:Al. The II-VI n-type layer is preferably less than 150 nm in thickness, and more preferably about 100 nm (or less). The II-VI n-type layer is a single layer emitter that replaces two or three components or layers of a conventional structure.

In block 206, the transparent II-VI n-type layer provides a dark current that is less than a device with a III-V emitter layer. In particularly useful embodiments, the dark current can be about one to three (or more) orders of magnitude less than a device with a III-V emitter layer. In block 208, the transparent II-VI n-type layer provides a reduced contact resistivity than a device with a III-V emitter layer and a metal ohmic contact. Resistivity improvement can be one order of magnitude (or greater) than device with a III-V emitter layer and a metal ohmic contact. In block 210, the transparent II-VI n-type layer can be formed with an on/off voltage ratio of about $10^7$ or greater. It should be understood that the photodiode may include additional components that provide other functions, such as buffer layers, multiple active layers, etc.

Having described preferred embodiments of highly responsive III-V photodetectors using ZnO:Al as n-type emitter (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

The invention claimed is:

1. A photodiode comprising:
   a p-type ohmic contact;
   a p-type substrate in contact with the p-type ohmic contact;
   an intrinsic layer formed over the substrate and including a III-V material; and
   a single combined emitter and n-type ohmic contact layer formed of a single material including a transparent II-VI n-type layer formed on the intrinsic layer.

2. The photodiode as recited in claim 1, wherein the II-VI n-type layer includes ZnO.

3. The photodiode as recited in claim 1, wherein the ZnO is Al doped.

4. The photodiode as recited in claim 1, wherein the II-VI n-type layer is less than 150 nm in thickness.

5. The photodiode as recited in claim 1, wherein the II-VI n-type layer is less than about 100 nm in thickness.

6. The photodiode as recited in claim 1, wherein the intrinsic layer includes InGaAs.

7. The photodiode as recited in claim 1, further comprising a dark current about three orders of magnitude less than a device with a III-V emitter layer.

8. The photodiode as recited in claim 1, wherein the II-VI n-type layer includes a reduced contact resistivity of one order of magnitude or greater than a device with a III-V emitter layer and a metal ohmic contact.

9. The photodiode as recited in claim 1, further comprising an on/off voltage ratio of about $10^7$.

10. A photodiode comprising:
a p-type ohmic contact;
a p+ III-V substrate in contact with the p-type ohmic contact;
a III-V intrinsic layer formed over the substrate; and
a single layer emitter including a combined emitter and n-type ohmic contact layer formed on the intrinsic layer from a single material including an Al doped ZnO, the Al doped ZnO including a thickness of less than 150 nm.

11. The photodiode as recited in claim 10, wherein the Al doped ZnO is less than about 100 nm in thickness.

12. The photodiode as recited in claim 10, further comprising a dark current about three orders of magnitude less than a device with a III-V emitter layer.

13. The photodiode as recited in claim 10, wherein the Al doped ZnO includes a reduced contact resistivity of one order of magnitude or greater than a device with a III-V emitter layer and a metal ohmic contact.

14. The photodiode as recited in claim 10, further comprising an on/off voltage ratio of about $10^7$.

15. A method for forming a photodiode, comprising:
providing a p-type ohmic contact, a p-type substrate in contact with the p-type ohmic contact and an intrinsic layer formed over the substrate and including a III-V material; and
forming a single combined emitter and n-type ohmic contact layer from a single material including a transparent II-VI n-type layer directly on the intrinsic layer.

16. The method as recited in claim 15, wherein the II-VI n-type layer includes ZnO.

17. The method as recited in claim 15, wherein the II-VI n-type layer is less than 150 nm in thickness.

18. The method as recited in claim 15, wherein forming includes forming the transparent II-VI n-type layer with a dark current of about three orders of magnitude less than a device with a III-V emitter layer.

19. The method as recited in claim 15, wherein forming includes forming the transparent II-VI n-type layer with a reduced contact resistivity of one order of magnitude or greater than a device with a III-V emitter layer and a metal ohmic contact.

20. The method as recited in claim 15, wherein forming includes forming the transparent II-VI n-type layer with an on/off voltage ratio of about $10^7$.

* * * * *